(12) United States Patent
Ogle et al.

(10) Patent No.: US 6,858,496 B1
(45) Date of Patent: Feb. 22, 2005

(54) OXIDIZING PRETREATMENT OF ONO LAYER FOR FLASH MEMORY

(75) Inventors: Robert B. Ogle, San Jose, CA (US); Arvind Halliyal, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/010,280

(22) Filed: Dec. 5, 2001

Related U.S. Application Data

(60) Provisional application No. 60/254,066, filed on Dec. 6, 2000.

(51) Int. Cl.[7] .................... H01L 21/336; H01L 21/762
(52) U.S. Cl. .................................. 438/261; 438/287
(58) Field of Search ................... 257/324; 438/216, 438/261, 287

(56) References Cited

U.S. PATENT DOCUMENTS

| | | | |
|---|---|---|---|
| 5,445,984 A | * | 8/1995 | Hong ........................ 438/261 |
| 5,661,056 A | * | 8/1997 | Takeuchi ................... 438/261 |
| 5,744,834 A | | 4/1998 | Lee ........................... 257/321 |
| 5,796,141 A | | 8/1998 | Lin et al. ................... 257/316 |
| 5,851,881 A | | 12/1998 | Lin et al. ................... 438/261 |
| 5,877,524 A | | 3/1999 | Oonakado et al. ......... 257/321 |
| 5,966,603 A | * | 10/1999 | Eitan ......................... 438/258 |

* cited by examiner

*Primary Examiner*—Long Pham
*Assistant Examiner*—Marcos D. Pizarro-Crespo
(74) *Attorney, Agent, or Firm*—Farjami & Farjami LLP

(57) ABSTRACT

A method of forming a dielectric structure for a flash memory cell includes forming a first layer of silicon dioxide, forming a layer of silicon nitride on the first layer of silicon dioxide, and pretreating the silicon nitride layer. Pretreatment of the silicon nitride layer includes oxidation. The method further includes depositing a second layer of silicon dioxide on the pretreated silicon nitride layer. Oxidation of the silicon nitride can occur in a batch process or in a single wafer tool, such as a single wafer rapid thermal anneal (RTA) tool. The oxidizing pretreatment of the nitride layer improves the integrity of the ONO structure and enables the second layer of silicon dioxide to be deposited rather than thermally grown. Because the nitride layer undergoes less change after deposition of the second layer of silicon dioxide, the present method improves the overall reliability of the ONO structure.

6 Claims, 2 Drawing Sheets

OXIDIZING PRETREATMENT OF ONO LAYER FOR FLASH MEMORY

CONTINUING DATA

This application claims priority to Provisional Application No. 60/254,066, filed on Dec. 6, 2000.

FIELD OF THE INVENTION

The present invention relates to a method of making a flash memory cell. More particularly, the present invention relates to an improved method of forming an interpoly dielectric ONO layer of the flash memory cell.

BACKGROUND OF THE INVENTION

"Flash memory", i.e., electrically erasable programmable read only memory (EEPROM) devices are electrically erasable, non-volatile memory devices fabricated with tunnel oxides and high voltage transistors for programming and erasing the devices.

Most flash EEPROM cells have a double polysilicon structure with the upper polysilicon layer patterned to form the control gates and the word lines of the structure. The lower polysilicon layer is patterned to form the floating gates. The lower polysilicon layer is deposited on a tunnel oxide, which is thermally grown on a silicon substrate. A dielectric layer separates the two polysilicon layers. The interpoly dielectric can be an oxide-nitride-oxide (ONO) structure. The nitride layer of the ONO structure is a memory nitride with the ability to store a charge and prevent electrons in the floating gate from escaping.

The dielectric ONO structure is formed by depositing a first layer of silicon dioxide. A layer of silicon nitride is then deposited on top of the silicon dioxide. Finally, the second layer of silicon dioxide is formed on the nitride layer. The second oxide layer is typically grown in a thermal oxidation process, such as a steam oxidation, of the nitride layer.

Several problems exist with the way in which the ONO structure is currently formed. First, thermal oxidation of the nitride layer is a slow process. As the second oxide grows, oxygen in the chamber must migrate further through the increasingly thicker second oxide layer to reach the silicon in the nitride layer. In addition, thermal oxidation decreases the thickness of the nitride layer, because the second oxide layer oxidizes silicon atoms in the nitride layer. As a result, the final thickness of the ONO structure can be difficult to determine. With the scaling down of the physical dimensions of the memory cells for next generation high density non-volatile memory devices, it is particularly important to be able to determine accurately the final thickness of the interpolysilicon ONO structure.

One approach is to deposit the second oxide on the nitride layer. Depositing oxide onto the nitride layer is faster than the oxidation process and does not significantly alter the thickness of the nitride layer. However, deposition of the oxide layer provides a second oxide layer that is more susceptible to leakage current. A id deposited oxide has inferior material properties compared to a thermally grown oxide, affecting the overall integrity of the ONO structure.

Accordingly, there is a need for an improved method of forming an ONO structure. The method should provide a faster process of forming the ONO structure. In addition, the method should improve the integrity of the ONO structure.

SUMMARY

An advantage of the present invention provides a method of forming an ONO structure which reduces fabrication time without compromising the integrity of the ONO structure. The present invention pretreats the nitride layer prior to deposition of a second layer of silicon dioxide, thereby enabling the second silicon dioxide layer to be formed without significantly altering the thickness of the silicon nitride layer.

In accordance with one embodiment of the present invention, a method of forming a dielectric structure for a flash memory cell includes forming a first layer of silicon dioxide, forming a layer of silicon nitride on the first layer of silicon dioxide, and pretreating the silicon nitride layer. Pretreatment of the silicon nitride layer includes oxidation. The method further includes depositing a second layer of silicon dioxide on the pretreated silicon nitride layer. Oxidation of the silicon nitride can occur in a batch process or in a single wafer tool, such as a single wafer rapid thermal anneal (RTA) tool.

In accordance with another embodiment of the invention, a method of making a flash memory cell is provided. The flash memory cell includes a substrate, a tunnel oxide and a first polysilicon layer. The method includes forming a first layer of silicon dioxide on the first polysilicon layer and forming a layer of silicon nitride on the first layer of silicon dioxide. The silicon nitride layer is then pretreated by oxidation, and a second layer of silicon dioxide is deposited on the pretreated silicon nitride layer.

In accordance with still another embodiment of the invention, a flash memory cell includes a substrate, a tunnel oxide, and first and second polysilicon layers. The tunnel oxide is disposed between the substrate and the first polysilicon layer. The second polysilicon layer is disposed a predetermined distance from the first polysilicon layer. The flash memory cell further includes an ONO structure sandwiched between the first and second polysilicon layers. The ONO structure includes a first oxide layer, a nitride layer formed on the first oxide layer, and a second oxide layer deposited on the nitride layer. The nitride layer of the ONO structure has been pretreated by oxidation prior to deposition of the second layer of oxide.

BRIEF DESCRIPTION OF THE DRAWINGS

The present invention can be further understood by reference to the following description and attached drawings which illustrate the preferred embodiment.

DETAILED DESCRIPTION

Figure 1:
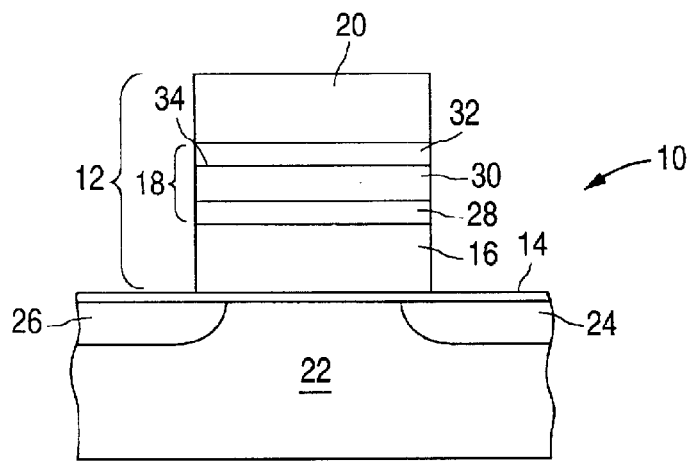
FIG. 1 is a sectional view of a flash memory cell in accordance with the present invention.

FIG. 1 illustrates a flash memory cell 10 in accordance with the present invention. Memory cell 10 has a stacked gate structure 12, including a tunnel oxide layer 14, a floating gate 16, a dielectric layer 18, and a control gate 20 formed on a silicon substrate 22. Floating gate 16 and control gate 20 are both layers of doped polysilicon. Alternatively, floating gate 16 and control gate 20 can include doped amorphous silicon. Memory cell 10 further includes source and drain regions 24 and 26, respectively, formed in substrate 22 on opposite sides of stacked gate structure 12.

Dielectric layer 18 is an oxide-nitride-oxide (ONO) structure comprising a bottom layer 28 of silicon dioxide, a top layer 32 of silicon dioxide, and a layer 30 of silicon nitride disposed between the two oxide layers 28 and 32. ONO structure 18 preferably has an electrical thickness in the range of approximately 100 Å to 200 Å with a dielectric constant of approximately 3.7 for the silicon dioxide.

Nitride layer 30 has a top surface 34 which as been pretreated prior to deposition of top oxide layer 32. Pretreatment improves the leakage current performance (i.e., reduces leakage current) across the ONO structure by improving the diffusion barrier characteristic of nitride layer 30. Pretreatment removes mobile ionic contaminants from nitride layer 30.

Figure 2:
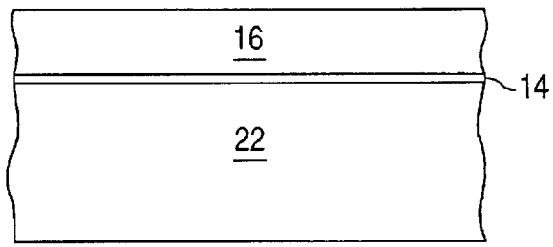
FIGS. 2–7 are sectional views illustrating the sequence of steps in the process of fabricating the flash memory cell illustrated in FIG. 1.

FIGS. 2–7 illustrate the process of forming memory cell 10, in particular, the formation of dielectric ONO structure 18. In FIG. 2, tunnel oxide 14 is grown on silicon substrate 22. Tunnel oxide 14 has a thickness from about 60 Å to 100 Å. Next, a layer of polysilicon which forms floating gate 16 is deposited on tunnel oxide 14.

Figure 3:
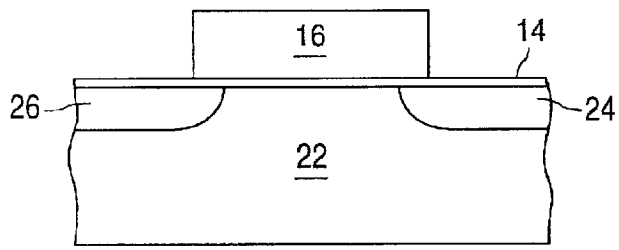

FIG. 3 illustrates the device after the layer of polysilicon has been etched. A photomask (not shown) is placed on top of the polysilicon layer, and the layer is etched to form floating gate 16. Substrate 22 is then doped with ions dopant to create source and drain regions 26 and 28, respectively.

Figure 4:
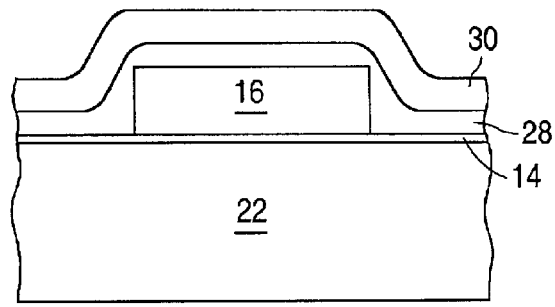

In FIG. 4, bottom silicon dioxide layer 28 of the ONO structure is deposited on top of tunnel oxide 14 and floating gate 16. Oxide layer 28 has a thickness in the range of about 40 Å to 70 Å.

Next, layer 30 of silicon nitride is deposited on oxide layer 28. Nitride layer 38 is approximately 50 A to 150 Å thick. Nitride layer 38 of the ONO structure is a memory nitride with the ability to store a charge.

In accordance with the present invention, prior to forming the final oxide layer of the ONO structure, nitride layer 30 is pretreated. The pretreatment includes oxidizing nitride layer 30 for a brief period of time in an oxygen or steam ambient. Pretreatment can occur in either a batch furnace or in a single wafer rapid thermal anneal (RTA) tool.

In a batch furnace, the oxidation process is performed at a temperature range from approximately 800° C. to 1050° C. for about 5 minutes to 15 minutes. A gas mixture including either oxygen or steam is used. For example, the gas mixture can include approximately 5% oxygen to 100% oxygen with a diluent of either argon or nitrogen. Alternatively, the mixture can include approximately 5% steam to 100% steam with a diluent of argon or nitrogen. The process can also be performed at an elevated pressure of between about 1 atm and 10 atm.

In a single wafer tool, the oxidation process is performed at a temperature range from approximately 800° C. to 1100° C. for about 0.1 second to 6 seconds. The gas mixture can include approximately 5% oxygen to 100% oxygen with a diluent of argon or nitrogen. In the alternative, approximately 1% steam to 10% steam with a diluent of argon or nitrogen can be used. The process can also be performed at an elevated pressure, similar to that for the batch process.

Figure 5:
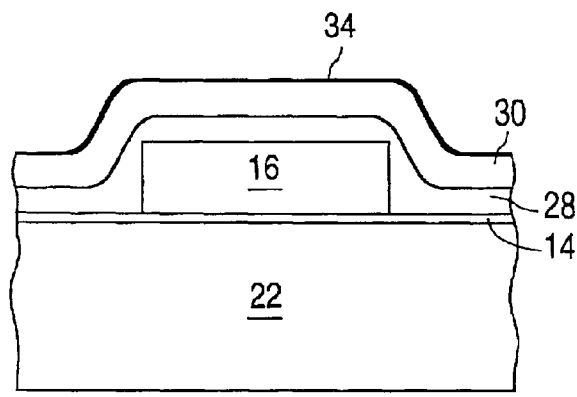

FIG. 5 illustrates the device following pretreatment of nitride layer 30. The oxidizing ambient reduces mobile ionic contaminants in the nitride layer and improves the electrical quality of the ONO structure. The thickness of nitride layer 30 is altered by less 10 Å to 20 Å.

Figure 6:
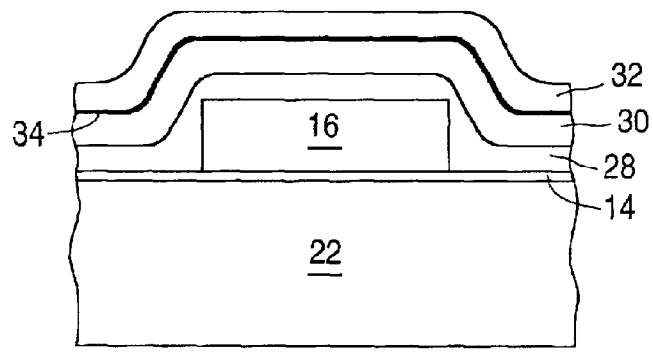

In FIG. 6, top layer 32 of silicon dioxide is then deposited on pretreated nitride layer 30 using conventional deposition techniques. Silicon dioxide layer 32 is preferably deposited using silicane ($SiH_4$) or dichlorosilicane ($SiCl_2H_2$) and nitrous oxide. The thickness of top oxide layer 32 is between approximately 30 Å and 50 Å. Because nitride layer 30 has been pretreated, top oxide layer 32 can be deposited without adversely affecting the overall leakage current of ONO structure 18.

Figure 7:
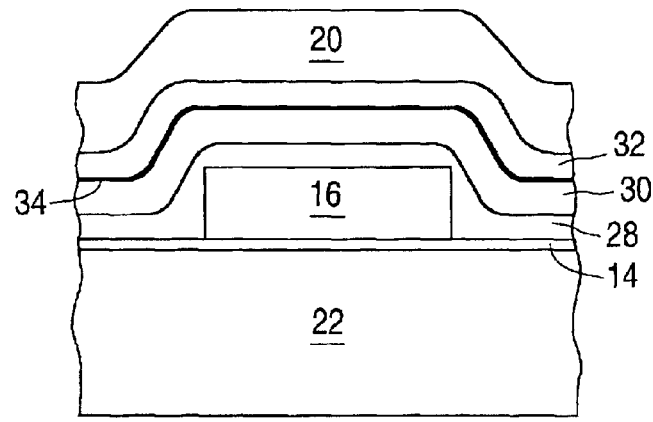

FIG. 7 illustrates the device after polysilicon layer 20 has been deposited. Polysilicon layer 20 forms the control gate of memory cell 10. Next, a photoresist mask (not shown) is formed. Portions of second polysilicon layer 32 and ONO structure 18 are then etched to form stacked gate structure 12 shown in FIG. 1.

Accordingly, the present invention provides an improved flash memory cell and method for making the sane. The fabrication process is faster because pretreatment of the nitride layer enables the top oxide layer of the ONO structure to be deposited rather than thermally grown. The method further allows forming thinner top oxide layer below that is currently achievable steam oxide. The oxidizing pretreatment of the nitride layer removes mobile ionic contaminants, thereby improving the integrity of the ONO structure.

While the present invention has been described with reference to a specific embodiment, the description is illustrative of the invention and is not to be construed as limiting the invention. Various modifications may occur to those skilled in the art without departing from the true spirit and scope of the invention as defined by the appended claims.

What is claimed is:

1. A method of forming a dielectric structure for a flash memory cell, the method comprising:

forming a first layer of silicon dioxide;

forming a silicon nitride layer on the first layer of silicon dioxide;

oxidizing the silicon nitride layer;

depositing a second layer of silicon dioxide on the pretreated silicon nitride layer after the oxidizing; and wherein oxidizing the silicon nitride layer occurs in a batch furnace at a temperature of approximately 800° C. to 1050° C. for approximately 5 min. to 15 ml.

2. A method of forming a dielectric structure for a flash memory cell, the method comprising:

forming a first layer of silicon dioxide;

forming a silicon nitride layer on the first layer of silicon dioxide;

oxidizing the silicon nitride layer;

depositing a second layer of silicon dioxide on the pretreated silicon nitride layer after the oxidizing; and wherein oxidizing the silicon nitride layer occurs in a single wafer tool at a temperature of approximately 800° C. to 1100° C. for approximately 0.1 s to 6 s.

3. A method of making a flash memory cell including a first polysilicon layer, the method comprising:

forming a first layer of silicon dioxide on the first polysilicon layer;

forming a silicon nitride layer on the first layer of silicon dioxide;

oxidizing the silicon nitride layer;

depositing a second layer of silicon dioxide on the silicon nitride layer after the oxidizing; and wherein oxidizing the silicon nitride layer occurs in a batch furnace at a temperature of approximately 800° C. to 1050° C. for approximately 5 min. to 15 min. with a gas mixture of approximately 5% oxygen to 100% oxygen and a diluent, the diluent comprising one of argon and nitrogen.

4. A method of making a flash memory cell including a first polysilicon layer, the method comprising:

forming a first layer of silicon dioxide on the first polysilicon layer;

forming a silicon nitride layer on the first layer of silicon dioxide;

oxidizing the silicon nitride layer;

depositing a second layer of silicon dioxide on the silicon nitride layer after the oxidizing; and wherein oxidizing the silicon nitride layer occurs in a batch furnace with a temperature of approximately 800° C. to 1050° C. for approximately 5 min. to 15 min. with a gas mixture of approximately 5% steam to 100% to steam and a diluent, the diluent comprising one of argon and nitrogen.

5. A method of making a flash memory cell including a first polysilicon layer, the method comprising:

forming a first layer of silicon dioxide on the first polysilicon layer;

forming a silicon nitride layer on the first layer of silicon dioxide;

oxidizing the silicon nitride layer;

depositing a second layer of silicon dioxide on the silicon nitride layer after the oxidizing; and wherein oxidizing the silicon nitride layer occurs in a single wafer tool at a temperature of approximately 800° C. to 1100° C. for approximately 0.1 s to 6 s with a gas mixture of approximately 5% oxygen to 100% oxygen and a diluent, the diluent comprising one of argon and nitrogen.

6. A method of making a flash memory cell including a first polysilicon layer, the method comprising:

forming a first layer of silicon dioxide on the first polysilicon layer;

forming a silicon nitride layer on the first layer of silicon dioxide;

oxidizing the silicon nitride layer;

depositing a second layer of silicon dioxide on the silicon nitride layer after the oxidizing; and wherein oxidizing the silicon-nitride layer occurs in a single wafer tool at a temperature of approximately 800° C. to 1100° C. for approximately 0.1 s to 6 s with a gas mixture of approximately 1% steam to 10% steam and a diluent, the diluent comprising one of argon and nitrogen.

* * * * *